United States Patent
Lee et al.

(10) Patent No.: US 7,666,739 B2
(45) Date of Patent: Feb. 23, 2010

(54) METHODS FOR FABRICATING A SPLIT CHARGE STORAGE NODE SEMICONDUCTOR MEMORY

(75) Inventors: Chungho Lee, Sunnyvale, CA (US); Ashot Melik-Martirosian, Sunnyvale, CA (US); Hiroyuki Kinoshita, San Jose, CA (US); Kuo-Tung Chang, Saratoga, CA (US); Sugimo Rinji, San Jose, CA (US); Wei Zheng, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 434 days.

(21) Appl. No.: 11/614,048

(22) Filed: Dec. 20, 2006

(65) Prior Publication Data
US 2008/0153222 A1    Jun. 26, 2008

(51) Int. Cl.
*H01L 21/336* (2006.01)
(52) U.S. Cl. ............... 438/260; 438/288; 257/E21.679
(58) Field of Classification Search .................. 438/260, 438/288, 739; 257/E21.18, E21.679
See application file for complete search history.

(56) References Cited

U.S. PATENT DOCUMENTS 6,750,103 B1 * 6/2004 Higashitani et al. ......... 438/261
7,432,156 B1 * 10/2008 Lee et al. .................... 438/260

* cited by examiner

*Primary Examiner*—Chandra Chaudhari

(57) ABSTRACT

Methods are provided for fabricating a split charge storage node semiconductor memory device. In accordance with one embodiment the method comprises the steps of forming a gate insulator layer having a first physical thickness and a first effective oxide thickness on a semiconductor substrate and forming a control gate electrode having a first edge and a second edge overlying the gate insulator layer. The gate insulator layer is etched to form first and second undercut regions at the edges of the control gate electrode, the first and second undercut region each exposing a portion of the semiconductor substrate and an underside portion of the control gate electrode. First and second charge storage nodes are formed in the undercut regions, each of the charge storage nodes comprising an oxide-storage material-oxide structure having a physical thickness substantially equal to the first physical thickness and an effective oxide thickness less than the first effective oxide thickness.

17 Claims, 5 Drawing Sheets

METHODS FOR FABRICATING A SPLIT CHARGE STORAGE NODE SEMICONDUCTOR MEMORY

TECHNICAL FIELD

The present invention generally relates methods for fabricating semiconductor memory devices, and more particularly relates to methods for fabricating split charge storage node nonvolatile semiconductor memory devices.

BACKGROUND

One form of semiconductor memory is a nonvolatile memory in which the memory state of a memory cell is determined by whether or not an electrical charge is stored on a charge storage layer built into the gate structure of a field effect transistor. To enhance the storage capacity of such a nonvolatile memory, two storage nodes can be built into each memory cell. The storage nodes are associated with locations in the charge storage layer at opposite sides of the gate structure. As the capacity of semiconductor memories increases, the size of each individual device that is used to implement the memory shrinks in size. With a memory that uses dual storage nodes per memory cell, the reduction in device size means that the spacing between the two storage nodes of a memory cell decreases. As the spacing between storage nodes decreases, problems arise with respect to the reliability and retention of the memory data, especially if the storage nodes are formed of a continuous layer of charge storage material. Charge stored in one memory node can leak through the charge storage layer to the other memory node of the memory bit to corrupt the memory stored at that other memory node. Additionally, as device size decreases, programming of one memory node can disturb the data stored in the other memory node due to relatively wide charge distributions in the charge storage layer. Such problems limit the possible choices for erasing such dual bit memory cells. One solution is to use charge storage nodes that are formed in charge storage layers separated by a channel oxide. If separated charge storage layers are used in the device, however, it is difficult to achieve the optimum thickness combinations of the channel oxide separating the storage nodes and the storage node insulators. Ideally the storage node and the channel oxide have substantially the same physical thickness, but the storage node layers have an effective oxide thickness less than the effective oxide thickness of the channel oxide.

Accordingly, it is desirable to provide methods for fabricating semiconductor memory devices that have enhanced isolation between memory storage nodes of a dual bit memory cell. In addition, it is desirable to provide methods for fabricating semiconductor memory devices in which a gate insulator separating two memory storage nodes can be formed independently of the insulators of the charge storage node. Additionally, it is desirable to provide methods for fabricating dual bit memory devices that can be erased by Fowler-Nordheim (FN) tunneling for less power consumption. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating a split charge storage node semiconductor memory device. In accordance with one embodiment the method comprises the steps of forming a gate insulator layer having a first physical thickness and a first effective oxide thickness on a semiconductor substrate and forming a control gate electrode having a first edge and a second edge overlying the gate insulator layer. The gate insulator layer is etched to form first and second undercut regions at the edges of the control gate electrode, the first undercut region and the second undercut region each exposing a portion of the semiconductor substrate and an underside portion of the control gate electrode. First and second charge storage nodes are formed in the undercut regions, each of the charge storage nodes comprising an oxide-storage material-oxide structure having a physical thickness substantially equal to the first physical thickness and an effective oxide thickness less than the first effective oxide thickness.

BRIEF DESCRIPTION OF THE DRAWINGS

The present invention will hereinafter be described in conjunction with the following drawing figures, wherein like numerals denote like elements, and wherein FIGS. 1 and 2 schematically illustrate, in cross section, a nonvolatile split charge storage node semiconductor memory cell in accordance with one embodiment of the invention.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
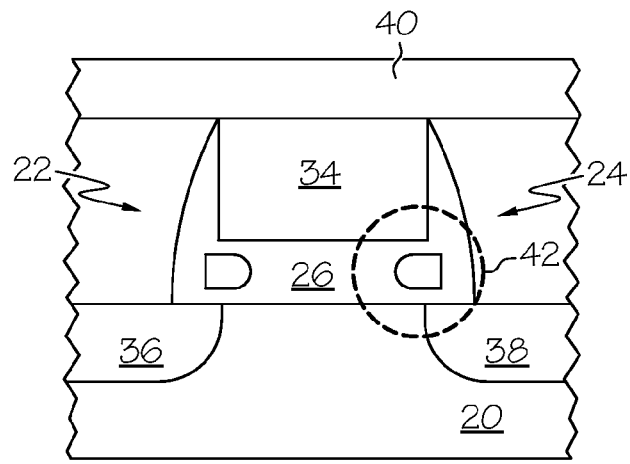
Figure 2:
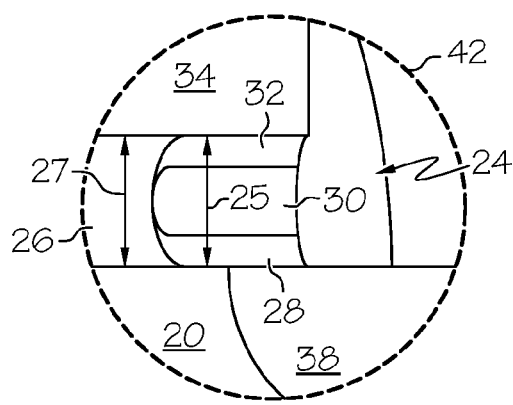

FIG. 1 schematically illustrates, in cross section, a dual storage bit semiconductor memory cell 18 in accordance with an embodiment of the invention. Memory cell 18 is formed in and on a semiconductor substrate 20 and includes two memory storage nodes 22 and 24 that are spaced apart by a channel insulator 26. A control gate 34 overlies the channel insulator and the two memory storage nodes. FIG. 2 illustrates, in cross section, a magnified portion 42 of semiconductor memory cell 18 and shows more clearly a memory storage node in accordance with an embodiment of the invention. Each of the memory storage nodes includes a thin tunnel insulator 28, a layer of charge storage material 30, and a top insulator 32, all formed in an undercut region of the control gate. In accordance with a preferred embodiment of the invention it is desired that the physical thickness of channel insulator 26, as indicated at 27, is the same as the physical thickness of memory storage nodes 22 and 24 as indicated at 25. In addition, in accordance with a further preferred embodiment of the invention the effective oxide thickness of the storage nodes is less than the effective oxide thickness of the channel insulator because a material is used for charge storage material 30 that has a higher dielectric constant, k, than the dielectric constant of the material of channel insulator 26. The effective oxide thickness is defined as the physical thickness of a dielectric layer divided by its dielectric constant and multiplied by the dielectric constant for silicon dioxide. For a layered structure the effective oxide thickness is the sum of the effective oxide thickness of each of the individual layers. Turning again to FIG. 1, two bit lines 36 and 38 are formed in the semiconductor substrate in alignment with the edges of the control gate. A nonvolatile semiconductor memory would include a plurality of memory cells similar to memory cell 18. A word line 40 overlies and is electrically coupled to control gate 34 and is coupled to a plurality of like control gates of memory cells along a row of the nonvolatile memory.

FIGS. 3-12 schematically illustrate, in cross section, method steps for fabricating a dual storage bit semiconductor memory including a memory cell such as memory cell 18 in accordance with various embodiments of the invention. Many of the steps employed in the fabrication of semiconductor devices are well known and so, in the interest of brevity, some of those conventional steps will only be mentioned briefly herein or will be omitted entirely without providing the well known process details.

Figure 3:
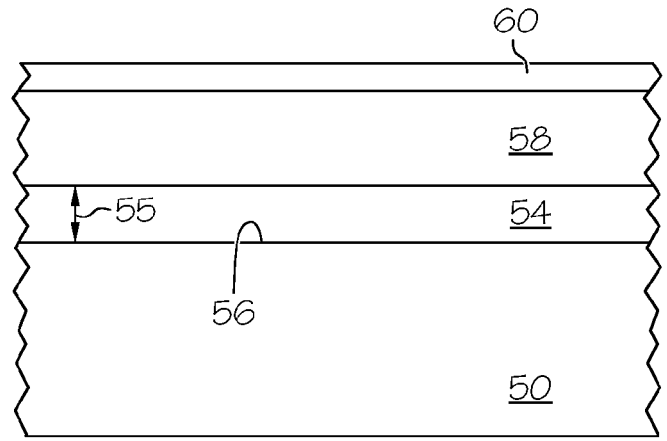
FIGS. 3-12 schematically illustrate, in cross section, method steps for fabricating a split charge storage node semiconductor memory cell in accordance with various embodiments of the invention.

As illustrated in FIG. 3, the method in accordance with one embodiment of the invention begins with providing a semiconductor substrate 50. Preferably the semiconductor substrate is a silicon substrate where the term "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. Semiconductor substrate 50 will herein generally be referred to for convenience, but without limitation, as a silicon substrate. The silicon substrate can be a bulk silicon wafer as illustrated, or can be a thin layer of silicon on an insulator (silicon on insulator or SOI) that, in turn, is supported on a semiconductor substrate. A layer of gate insulator 54 having a physical thickness indicated by arrow 55 is formed at surface 56 of the silicon substrate, and a layer of gate electrode forming material 58 is deposited over the layer of gate insulator. A layer 60 of hard mask material is deposited over the layer of gate electrode forming material. The gate insulator is preferably silicon dioxide having a physical thickness of about 15-40 nanometers (nm), and most preferably a physical thickness of about 20 nm. The layer of gate electrode forming material is preferably polycrystalline silicon having a thickness of about 50-150 nm. The gate electrode forming material will hereinafter be referred to, for ease of reference but without limitation, as polycrystalline silicon. The polycrystalline silicon can be deposited, for example, by the reduction of silane ($SiH_4$) in a chemical vapor deposition (CVD) reaction. If the layer of gate insulator is silicon dioxide, the layer can be grown by the thermal oxidation of the silicon substrate. The gate insulator, whether silicon dioxide or other dielectric material, can also be deposited, for example by CVD, low pressure chemical vapor deposition (LPCVD) or plasma enhanced chemical vapor deposition (PECVD). A gate insulator deposition step may be followed by a thermal anneal to density the layer. The gate insulator material is characterized by a dielectric constant, K. As noted above, it is instructive to define the "effective oxide thickness" (EOT) of dielectric layers as the physical thickness of a dielectric layer divided by its dielectric constant and multiplied by the dielectric constant for silicon dioxide. Effective oxide thickness thus serves to normalize the insulator thickness based on dielectric constant relative to the dielectric constant of silicon dioxide. The layer of hard mask material can be, for example, a layer of silicon oxide having a thickness of about 30 nm deposited by CVD from a tetraethylorthosilicate (TEOS) source or a thin layer of silicon oxide and a thicker overlying layer of silicon nitride. The layer of silicon nitride can be deposited, for example, by LPCVD from the reaction of dichlorosilane and ammonia.

Figure 4:
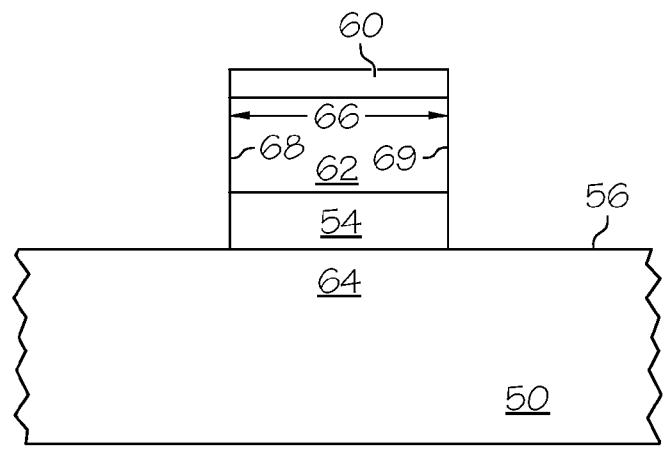

The method continues, as illustrated in FIG. 4, by the patterning and etching of the layers of hard mask material, polycrystalline silicon, and gate insulator to form a control gate electrode 62. The patterned control gate electrode overlies a channel 64 at the near surface of the semiconductor substrate. In accordance with one embodiment of the invention, the control gate electrode can be patterned to have a length indicated by double headed arrow 66 of about 50-160 nm between gate edges 68 and 69.

Figure 5:
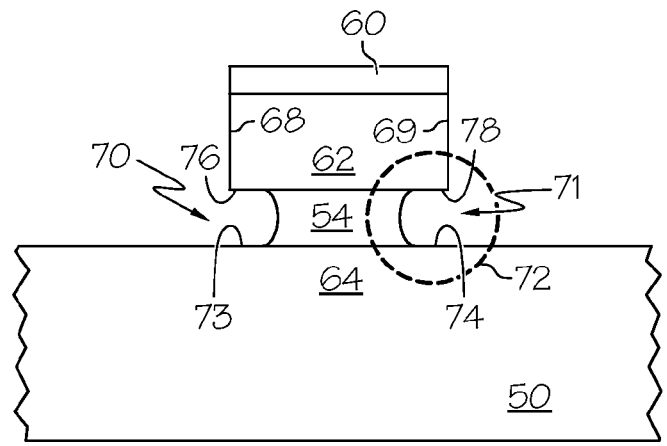

In accordance with one embodiment of the invention the method continues as illustrated in FIG. 5 by the undercut etching of gate insulator layer 54 to form undercut regions 70 and 71 at edges 68 and 69, respectively, of control gate electrode 62. The gate insulator can be isotropically etched, for example, by vapor phase HF etching or by etching in a solution of dilute hydrofluoric acid. Preferably, for a 100 nm gate length, the undercut regions extend under the control gate electrode for a distance of about 25 nm and expose portions 73 and 74 of silicon substrate 50 and portions 76 and 78 of the underside of control gate electrode 62. In accordance with an embodiment of the invention it is desired to form a memory storage node in each of undercut regions 70 and 71 with those memory storage regions separated by the unetched portion of gate insulator 54. Each of the memory storage nodes is to be a layered structure generally of the form O-X-O where the first "O" represents a tunnel dielectric layer, the "X" represents a layer of charge storage material, and the second "O" represents a top dielectric layer. The method steps for achieving such a structure in accordance with one embodiment of the invention are illustrated in FIGS. 6-8 which show an enlarged view of the region indicated by the dashed circle 72 in FIG. 5.

Figure 15:
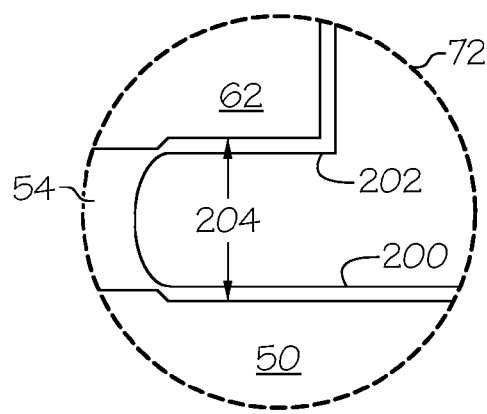
FIG. 15 schematically illustrates a method for fabricating a split charge storage node semiconductor memory device that is not in accordance with the invention.

If the two dielectric layers of the layered memory storage node structure, dielectric layers 200, 202 are formed by thermally oxidizing the exposed portion of the silicon substrate and the exposed underside of polycrystalline silicon control gate electrode 62, the silicon dioxide layers will be partially recessed into the surface of the silicon substrate and into the underside of the polycrystalline silicon control gate electrode as silicon is combined with oxygen to form the silicon dioxide. The oxidation process thus causes the undesired result of the layered structure having a greater physical thickness 204 than the physical thickness 55 of gate insulator 54 as illustrated in FIG. 15.

Figure 6:
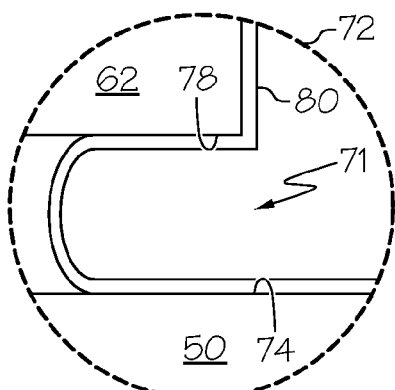
Figure 7:
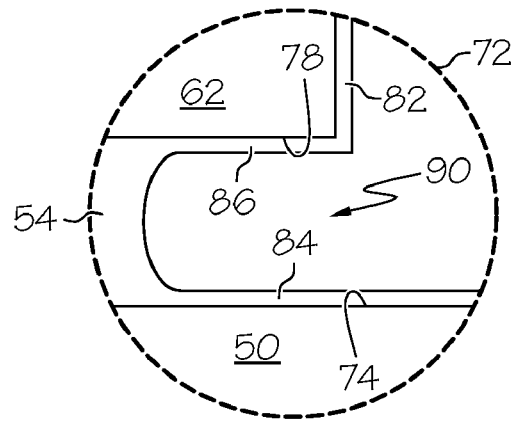
Figure 8:
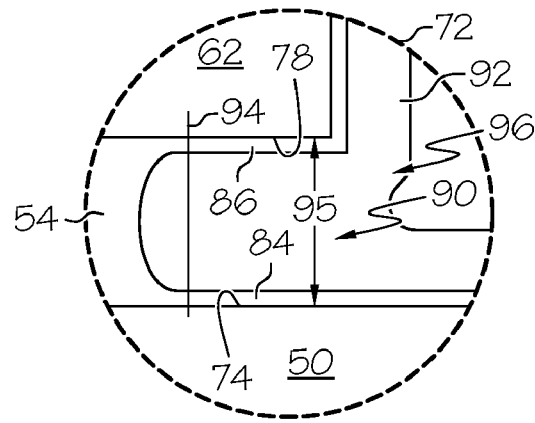

In contrast to the formation of layers 200 and 202 in the manner just described, in accordance with an embodiment of the invention the requisite dielectric layers are formed as illustrated in FIGS. 6 and 7. As illustrated in FIG. 6, the method continues by the deposition of a silicon layer 80 having a thickness of about 2-5 nm. The silicon layer can be either a polycrystalline silicon layer or an amorphous silicon layer and can be deposited, for example, by PECVD or LPCVD. The deposition of silicon layer 80 provides a thin layer of silicon on exposed portion 74 of silicon substrate 50 and on exposed portion 78 of the underside of control gate electrode 62.

As illustrated in FIG. 7, silicon layer 80 is heated in an oxidizing ambient to completely oxidize the layer, forming a silicon dioxide layer 82. Silicon layer 80 supplies the silicon needed for the formation of silicon dioxide layer 82, so substantially none of silicon substrate 50 or polycrystalline silicon control gate electrode 62 is consumed in the oxidation process. Silicon dioxide layer 82 forms a tunnel oxide layer 84 on the exposed portion of the silicon substrate and a top oxide 86 on the exposed portion of the underside of control gate electrode 62. The oxidation of silicon layer 80 leaves a void 90 between tunnel oxide layer 84 and top oxide layer 86.

In accordance with an embodiment of the invention, the method continues by depositing a layer of charge storage material 92 to fill void 90 as illustrated in FIG. 8. The layer of charge storage material can be polycrystalline silicon, silicon nitride, or preferably silicon rich silicon nitride. Silicon rich silicon nitride is a silicon nitride having a silicon content greater than the silicon content of stoichiometric silicon nitride. Silicon rich nitride is more conductive than stoichiometric silicon nitride and tends to have shallower trap energy levels and higher trap density, both of which allow electrons to move easily to enable Fowler-Nordheim erase of the memory storage node. The layer of charge storage material can be deposited, for example, by LPCVD. To insure that void 90 is completely filled, it may be advantageous to use multiple partial deposition/partial etch steps. Viewed along a cross section at line 94, the undercut region is now completely filled with a charge storage layer sandwiched between dielectric layers. The layer of charge storage material sandwiched between dielectric layers forms one charge storage node 96 of a dual node nonvolatile memory cell. A second and similar charge storage node 98 (not illustrated in this figure) fills undercut region 70 at the opposite edge of control gate electrode 62. The thickness of the dielectric layers and the thickness and composition of the charge storage layer are selected, in accordance with an embodiment of the invention, so that the composite effective oxide thickness of the layers filling undercut regions 70 and 71 is less than the effective oxide thickness of gate insulator layer 54. In addition, because the layered structure is formed in accordance with an embodiment of the invention, the layered structure has a physical thickness, indicated by double headed arrow 95, substantially the same as the physical thickness of gate insulator layer 54. The inventive memory cell can be programmed by channel hot carrier injection, but the thinner EOT in the charge storage node allows Fowler-Nordheim erasing.

Figure 9:
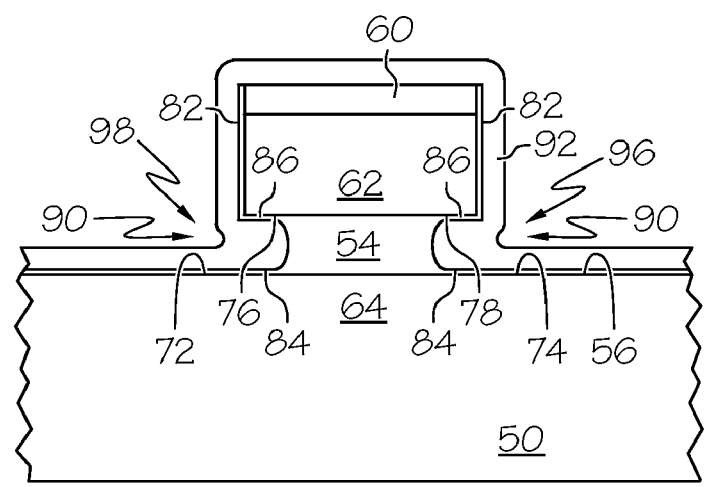
Figure 10:
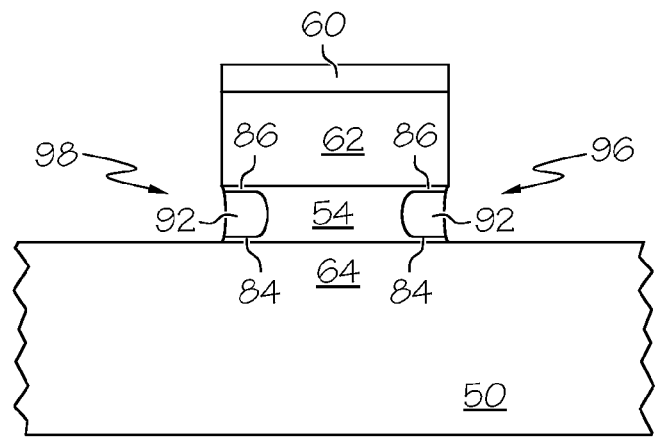

Following the deposition of layer of charge storage material 92, the device structure appears as illustrated in FIG. 9 with the layer of charge storage material covering control gate electrode 62 as well as filling void 90. The layer of charge storage material and silicon dioxide layer 82 are removed from the top and sidewalls of control gate electrode 62. If the charge storage layer is silicon, the silicon can be converted to a silicon oxide by thermal oxidation and the silicon oxide can be removed by wet etching with a dilute HF solution. This is a more controllable removal method than direct etching of the silicon layer. If the charge storage material is silicon nitride or silicon rich silicon nitride, that layer can be removed by etching in phosphoric acid ($H_3PO_4$). Silicon dioxide layer 82 can be removed by etching in a dilute HF solution. The partially fabricated memory storage cell appears as illustrated in FIG. 10 after such conversion/removal. As illustrated in this figure, the memory storage cell includes a control gate electrode 62 that overlies a central gate insulator 54 and two charge storage nodes 96 and 98 that are separated by the central gate insulator.

Figure 11:
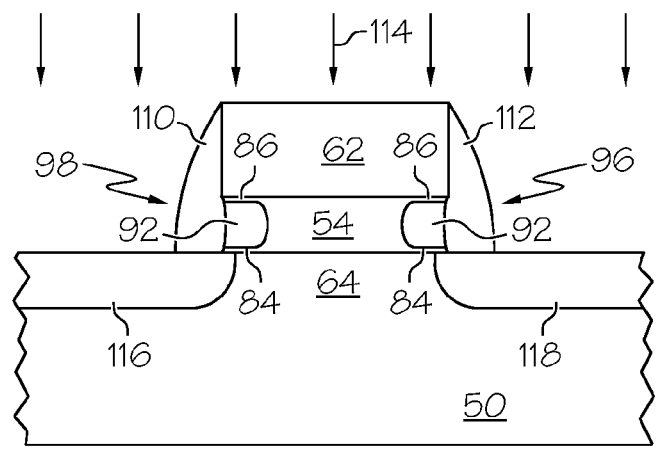

The method continues, in accordance with an embodiment of the invention, with the deposition of a layer of spacer forming material (not illustrated) such as a layer of silicon oxide or silicon nitride. The layer of spacer forming material is anisotropically etched, for example by reactive ion etching, to form sidewall spacers 110 and 112 at the sidewalls of control gate electrode 62 as illustrated in FIG. 11. The anisotropic etching can also be used to remove the remainder of hard mask 60. The sidewall spacers can be used, together with control gate electrode 62, as an ion implantation mask while conductivity determining ions are implanted into the surface of semiconductor substrate 50 as indicated by arrows 114 to form bit lines 116 and 118 spaced apart from but self aligned with control gate electrode 62 and charge storage nodes 96 and 98.

Figure 12:
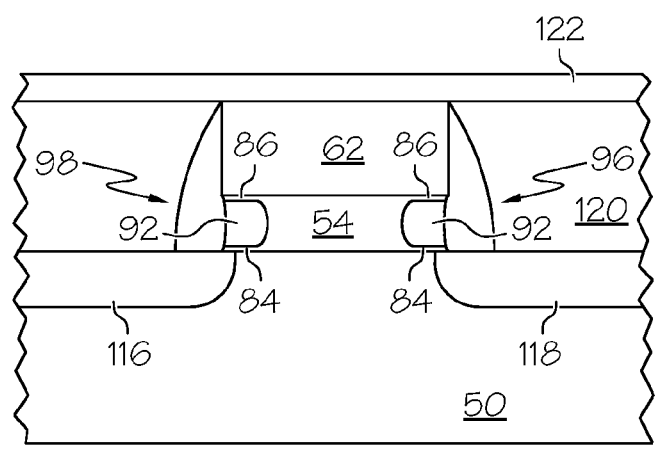

As illustrated in FIG. 12, a layer of insulating material 120 is deposited over the control gate electrode, sidewall spacers, and implanted bit lines. The insulating layer is planarized, for example by chemical mechanical planarization (CMP) or can be selectively etched, for example by a photolithography and etch process to expose a contact area on control gate 62. A conductive material 122, such as doped polycrystalline silicon is deposited on the insulating layer and is photolithographically patterned and etched to form a word line contacting gate electrode 62 as well as a plurality of other control gates of other memory storage cell along a row of the nonvolatile semiconductor memory.

Figure 13:
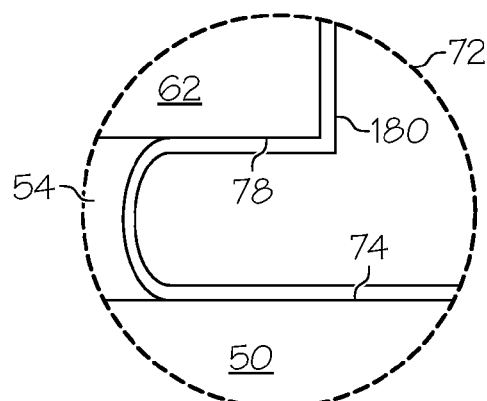
FIGS. 13 and 14 schematically illustrate, in cross section, method steps for fabricating a split charge storage node semiconductor memory cell in accordance with an alternate embodiment of the invention.
Figure 14:
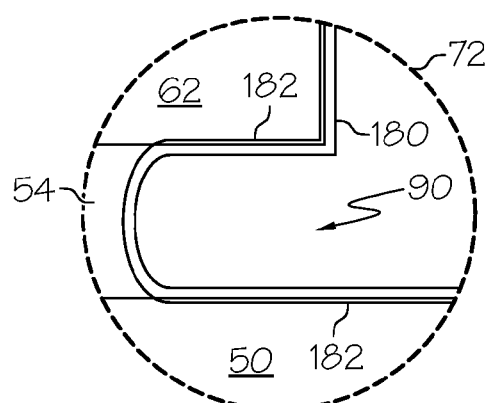

FIGS. 13 and 14 illustrate, in cross section, method steps for fabricating a split charge storage node semiconductor memory cell in accordance with an alternate embodiment of the invention. In accordance with this alternate embodiment the method begins in the same manner as illustrated and described above with respect to FIGS. 3-5. As illustrated in FIG. 13, the method in accordance with this embodiment continues by the deposition of an oxide layer 180. The oxide layer can be deposited, for example, by a process of LPCVD or PECVD to a thickness of about 2-5 nm by the reaction of silane and oxygen. Layer 180 is deposited on the exposed portion 74 of silicon substrate 50 and on the exposed portion 78 of the underside of control gate electrode 62 without consuming any silicon from either the substrate or the control gate electrode.

As illustrated in FIG. 14, oxide layer 180 can be densified, for example, by heating the layer to a temperature of about 800-1000° C. for about 10-60 seconds. The ambient during the densification step can be, for example, dry oxygen. If the densification ambient is an oxidizing ambient such as oxygen, a small amount of thermal oxide 182 will be grown at the interface between oxide layer 180 and the silicon substrate and at the interface between oxide layer 180 and the polycrystalline silicon control gate electrode. Because the densification cycle is relatively short, the amount of thermal oxide that is grown is small, the amount of silicon consumed is small, and the resultant layered structure has substantially the same physical thickness as gate insulator 54. For example, the thickness of the thermally grown layer of silicon dioxide can be monitored to be less than about 5 nm. The method in accordance with this embodiment of the invention can then be continued in the same manner as illustrated and described above with respect to FIGS. 8-12.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a split charge storage node semiconductor memory device comprising the steps of:

forming a gate insulator layer on a surface of a semiconductor substrate;

depositing a layer of gate electrode forming material overlying the gate insulator layer and patterning the layer of gate electrode forming material to form a control gate electrode having a first edge and a second edge;

etching the gate insulator layer to form an undercut region at each of the first edge and the second edge of the control gate electrode, the undercut region exposing a portion of the semiconductor substrate and an underside portion of the control gate electrode;

depositing a layer of silicon in the undercut region to form a first layer of silicon on the portion of the semiconductor substrate and a second layer of silicon on the underside portion of the control gate electrode;

oxidizing the layer of silicon to form a first layer of silicon oxide on the portion of the semiconductor substrate and a second layer of silicon oxide on the underside portion of the control gate electrode and leaving a void between the first layer of silicon oxide and the second layer of silicon oxide; and filling the void with a charge storage material.

2. The method of claim 1 wherein the step of filling the void comprises the step of depositing a material selected from the group consisting of polycrystalline silicon, silicon nitride, and silicon rich silicon nitride.

3. The method of claim 1 wherein the step of forming a gate insulator comprises the step of growing a layer of silicon dioxide having a first physical thickness and a first effective oxide thickness.

4. The method of claim 3 wherein the steps of depositing a layer of silicon, oxidizing the layer of silicon, and filling the void with a charge storage material comprise the steps of forming an oxide-charge storage material-oxide structure having a physical thickness substantially equal to the first physical thickness.

5. The method of claim 4 wherein the steps of depositing a layer of silicon, oxidizing the layer of silicon, and filling the void with a charge storage material comprise the steps of forming an oxide-charge storage material-oxide structure having an effective oxide thickness less than the first effective oxide thickness.

6. The method of claim 1 further comprising the step of forming a first bit line and a second bit line in the semiconductor substrate, the first bit line aligned with the first edge and the second bit line aligned with the second edge.

7. The method of claim 1 wherein the step of depositing a layer of silicon comprises the step of depositing a layer of amorphous silicon.

8. A method for fabricating a split charge storage node semiconductor memory device comprising the steps of:

forming a gate insulator layer having a first physical thickness and a first effective oxide thickness on a surface of a semiconductor substrate;

depositing a layer of gate electrode forming material overlying the gate insulator layer and patterning the layer of gate electrode forming material to form a control gate electrode having a first edge and a second edge;

etching the gate insulator layer to form a first undercut region at the first edge and a second undercut region at the second edge, the first undercut region and the second undercut region each exposing a portion of the semiconductor substrate and an underside portion of the control gate electrode;

forming a first charge storage node in the first undercut region and a second charge storage node in the second undercut region, each of the first charge storage node and the second charge storage node comprising an oxide-storage material-oxide structure having a physical thickness substantially equal to the first physical thickness and an effective oxide thickness less than the first effective oxide thickness, wherein the step of forming a first charge storage node and a second charge storage node comprises the steps of: depositing a layer of silicon in the first undercut region and the second undercut region, oxidizing the first layer of silicon, and depositing a layer of storage material on the oxidized first layer of silicon, wherein the layer of storage material comprises silicon nitride; and etching the layer comprising silicon nitride to remove the layer from the first edge and the second edge.

9. The method of claim 8 further comprising the step of forming a first bit line aligned with the first edge and a second bit line aligned with the second edge.

10. The method of claim 9 further comprising the step of depositing and patterning a layer of conductive material to form a word line coupled to the control gate electrode.

11. A method for fabricating a split charge storage node semiconductor memory device comprising the steps of:

forming a gate insulator layer having a first physical thickness and a first effective oxide thickness on a surface of a semiconductor substrate;

depositing a layer of gate electrode forming material overlying the gate insulator layer and patterning the layer of gate electrode forming material to form a control gate electrode having a first edge and a second edge;

etching the gate insulator layer to form a first undercut region at the first edge and a second undercut region at the second edge, each of the undercut regions exposing a portion of the semiconductor substrate and an underside portion of the control gate electrode;

depositing a first layer of oxide on the portion of the semiconductor substrate and on the underside portion in the first undercut region and in the second undercut region;

heating in an oxidizing ambient to densify the first oxide layer and to grow a thin second oxide layer on the portion of the semiconductor substrate and the underside portion, the steps of depositing a first oxide layer and heating in an oxidizing ambient leaving a void in each of the undercut regions; and depositing a layer of charge storage material onto the densified first layer of oxide to fill the voids.

12. The method of claim 11 wherein the step of depositing a layer of charge storage material comprises the step of depositing a material selected from the group consisting of polycrystalline silicon, silicon nitride, and silicon rich silicon nitride.

13. The method of claim 12 wherein the steps of depositing a first oxide layer, heating in an oxidizing ambient, and depositing a layer of charge storage material comprise the step of forming a layered structure having an effective oxide thickness less than the first effective oxide thickness.

14. The method of claim 12 wherein the steps of depositing a first oxide layer, heating in an oxidizing ambient, and depositing a layer of charge storage material comprises the step of forming a layered structure having a second physical thickness substantially equal to the first physical thickness.

15. The method of claim 11 wherein the step of etching the gate insulator comprises the step of etching the gate insulator to form the first undercut region separated by a residual portion of the gate insulator layer from the second undercut region.

16. The method of claim 15 wherein the steps of depositing a first oxide layer, heating in an oxidizing ambient, and depositing a layer of charge storage material comprise the step of forming a first layered charge storage structure and a second layered charge storage structure separated by the residual portion of the gate insulator.

17. The method of claim 11 further comprising the step of depositing and patterning a layer of conductive material to form a word line coupled to the control gate electrode.

\* \* \* \* \*